Figure 1:
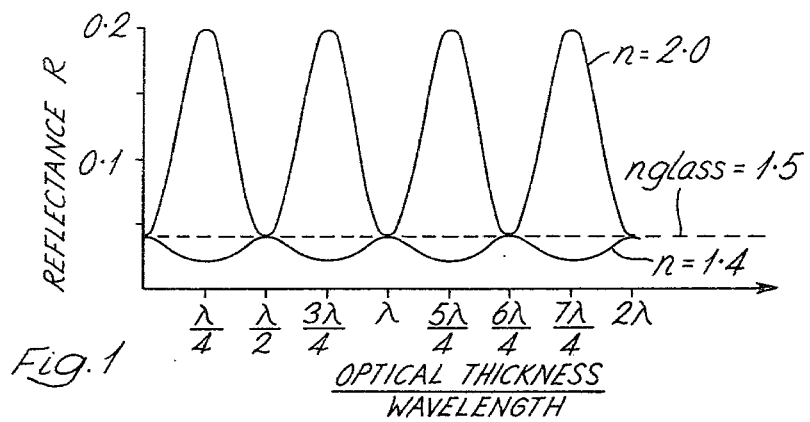

United States Patent [19]

Holland

[11] 4,311,725

[45] Jan. 19, 1982

[54] CONTROL OF DEPOSITION OF THIN FILMS

[75] Inventor: Leslie Holland, Crowley, England

[73] Assignee: National Research Development Corporation, London, England

[21] Appl. No.: 192,524

[22] PCT Filed: Aug. 10, 1979

[86] PCT No.: PCT/GB79/00138

§ 371 Date: Apr. 18, 1980

§ 102(e) Date: Mar. 20, 1980

[87] PCT Pub. No.: WO80/00504

PCT Pub. Date: Mar. 20, 1980

[30] Foreign Application Priority Data

Aug. 18, 1978 [GB] United Kingdom ............... 33927/78

[51] Int. Cl.$^3$ ....................... G05D 5/03; C23C 13/08; C23C 15/00; G01B 7/06

[52] U.S. Cl. ..................................... 427/10; 118/664; 118/665; 204/192 R; 204/298

[58] Field of Search .................. 118/664, 665; 427/10; 204/192 R, 298

[56] References Cited

U.S. PATENT DOCUMENTS 3,400,687 9/1968 Lueck ............................. 118/665 X

OTHER PUBLICATIONS

Lue, "An Optimum Thickness Indicator for Evaporating Metals on Schottky Barrier Solar Cells", *Journal of Physics E: Scientific Instruments*, vol. 11, Jan. 1978, pp. 84-86.

Putner, "The Vacuum Deposition of Metaloxide Films by Automatic Control", *Optics and Laser Technology*, vol. 4, No. 2, Apr. 1972, pp. 79-86.

Leybold-Heraeus, "Optical Monitoring of the Production of Thin Films in Vacuum" undated.

Vidal et al., "Optical Monitoring of Nonquarterwave Multilayer Filters", *Applied Optics*, vol. 17, Apr. 1, 1978, pp. 1038-1047.

*Primary Examiner*—James R. Hoffman
*Attorney, Agent, or Firm*—Cushman, Darby & Cushman

[57] ABSTRACT

In apparatus for sensing and controlling the deposition of a thin film on to a substrate (12) from a gas or vapor phase, the optical reflectance or transmittance is sensed, the resonant frequency of a crystal (14) also exposed to the deposition is sensed, and the quotient of the change in each signal over a predetermined time interval is determined. The deposition can be terminated at a suitable thickness, for example a reflectance or transmittance maximum or minimum. Instead of an optical property, the electrical resistivity of the film may be sensed and used in the same way.

10 Claims, 6 Drawing Figures

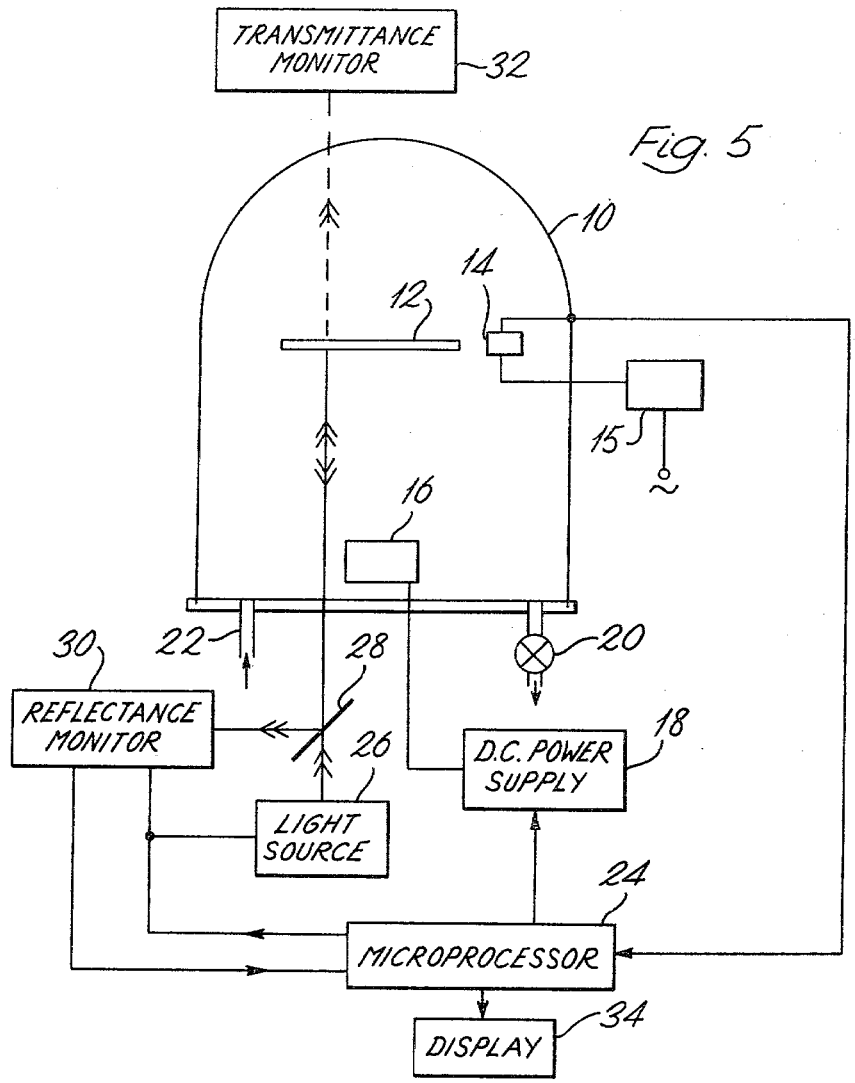

CONTROL OF DEPOSITION OF THIN FILMS

This invention relates to a method and apparatus for determining and controlling the properties of a thin film during deposition of that film. In this specification, the term "thin film" means a film less than about 20 micrometers thick, and usually about 0.1 micrometers thick, and the words 'optical' and 'light' mean electromagnetic radiation at infra-red, visible and ultra-violet wavelengths.

A film of this thickness may be referred to as an optical interference film, because its optical thickness, that is the product of its geometrical thickness and its refractive index, is usually a fraction of the wavelength of light, but may also be up to about three times the magnitude of the wavelength. Optical interference effects may occur due to a phase difference introduced by the film between two light waves reflected respectively at the two film boundaries.

Films of this thickness are often applied to a substrate to alter the reflection properties of the substrate, for example to glass to give an anti-reflecting surface at visible wavelengths, or to a semi-conducting material to give an anti-reflecting surface at infra-red wavelengths; the films may also be applied to provide beam splitters and broad and narrow band-pass filters at ultra-violet, visible, and infra-red wavelengths, or to give mechanical protection to a surface or to impart electrical conductivity to it. Single layer films may be required, or multilayer films comprising films of different optical properties. The films may be applied by any physical vapour deposition (PVD) or chemical vapour deposition (CVD) process. In a PVD process, a material is sputtered or evaporated; examples are d.c. sputtering, radio frequency sputtering, magnetron sputtering; electron beam evaporation; ion plating; and glow discharge. In a CVD process a material is decomposed by heat, optionally into a plasma, and optionally an active gas may be added. In some examples of both basic types of decomposition, an ionised atmosphere is generated in the vicinity of the substrate. Materials used vary over a very wide range, and may be elements or compounds, metals, semiconductors, or insulators.

It is usual to monitor the film growth rate and thickness, and to monitor and control the substrate temperature and the constitution and pressure of the atmosphere in the deposition vessel. Additional variables may be monitored and controlled, depending on the deposition process.

The present invention is applicable to the majority of such films and is largely independent of the material of the film or the method of application.

In the prior art, it is known to monitor indirectly the geometrical film thickness L by use of a high frequency crystal microbalance. A quartz crystal is positioned near the surface to be coated so that the material is deposited at a constant thickness over the surface of the substrate and the crystal. If the deposit is mass m per unit area, and p is the density, then $m/p=L$; if it is assumed that the film refractive index n and its density are constant during deposition, then the optical thickness nL is proportional to the mass deposited. The mass deposited on the crystal causes a change in resonance frequency, the change in oscillating frequency of the crystal from the original frequency is sensed and this value has been used to control the rate of deposition of material.

It is also known to monitor the reflectance R or transmittance T of the deposited film, during the deposition process, by means of a beam photometer, or to monitor the electrical resistivity of an electrically conductive film, and to use such a measured value to determine when a required value of the measured property has been reached; deposition is then terminated.

These three measurements have been made simultaneously by separate instruments since about 1962, but the output signals of the instruments have never in any way been combined.

It has also been suggested that, to allow precise control of the final film thickness, it would be desirable to measure the differential with respect to time t of reflectance or transmittance, i.e. $dR/dt$ or $dT/dt$. This has the disadvantage that it is assumed that the film optical thickness nL increases linearly time. In practice this is not the case; for example when a powder source is used, volatilization may occur as a series of discrete events as particles come into contact with the heat source; this causes fluctuations and instabilities which are undesirable.

From a theoretical point of view, the basic need is to determine the differential with respect to film optical thickness of the measured variable, for example $dR/d(nL)$, and it has been suggested that this can be derived from the differential with respect to time. However, such a derivation depends on the incorrect assumption that thickness increase is linear. Previously, there have been practical difficulties in directly determining the change in optical thickness, and no method of directly determining the differential with respect to optical thickness has been suggested which eliminates the effect of the temporal variations.

According to the invention, apparatus for sensing and controlling the deposition of a thin film on to a substrate from a gas or vapour phase comprises sensing means arranged to sense the optical reflectance or optical transmittance or electrical resistivity of the deposited film and to provide a first signal having a value representative of the value of the sensed property;

an oscillatable crystal, usually a quartz crystal, arranged adjacent to the substrate with at least one surface of the crystal exposed to the gas or vapour phase;

and timing and calculating means connected to the sensing means and to the oscillatable crystal and arranged to determine the absolute resonance frequency of the oscillatable crystal, to provide a second signal representative of that frequency, to determine the quotient of the change in the first signal and the change in the second signal over a first predetermined time interval, and to provide an output signal dependent on said quotient.

The timing and calculating means may be means such as a computer or microprocessor having a built-in clock. The change in resonance frequency of the crystal may be determined by a measurement either of the absolute frequency or of the resonance period. The first predetermined time interval is conveniently the period of the oscillatable crystal, which is typically $10^{-6}$ seconds.

It may in some circumstances be desirable to average the quotient over a second time interval, usually considerably longer than the first time interval and typically 1 second. This interval may be a predetermined time interval chosen so that the average quotient is unaffected by temporal fluctuations in the deposition rate.

Alternatively it may be a variable time interval, corresponding to a predetermined increase in film thickness.

For convenience, the first signal is arranged to be in the form of a frequency signal, the value of frequency representing the value of optical reflectance or transmittance or electrical resistivity, and the second signal is the output of the oscillatable crystal. The two frequency signals can then be digitised and the numbers used to calculate quotient or averaged quotient.

Also according to the invention, a method of sensing and controlling the deposition of a thin film on to a substrate from a gas or vapour phase comprises:

sensing the optical reflectance or optical transmittance or electrical resistivity of the deposited film and providing a first signal having a value representative of the value of the sensed property;

arranging an oscillatable crystal adjacent the substrate with at least one surface of the crystal exposed to the gas or vapour phase;

determining by timing and calculating means the absolute resonance frequency of the oscillatable crystal and deriving a second signal having a value representative of said resonance frequency;

determining over a first predetermined interval of time the quotient of the change in the first signal and the change in the second signal;

providing an output signal dependent on said quotient;

and controlling the variable of the deposition process in accordance with the output signal.

Figure 2:
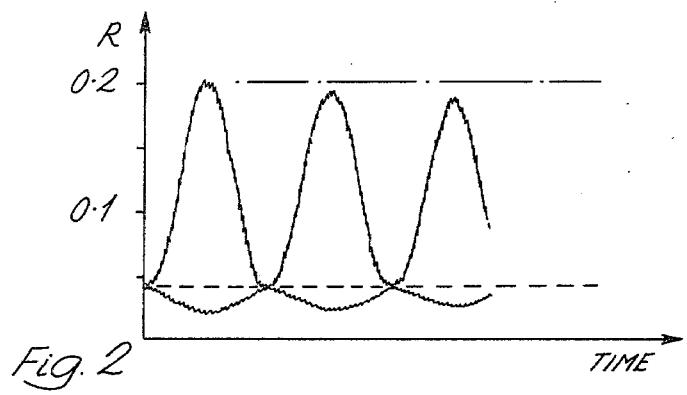
Figure 3:
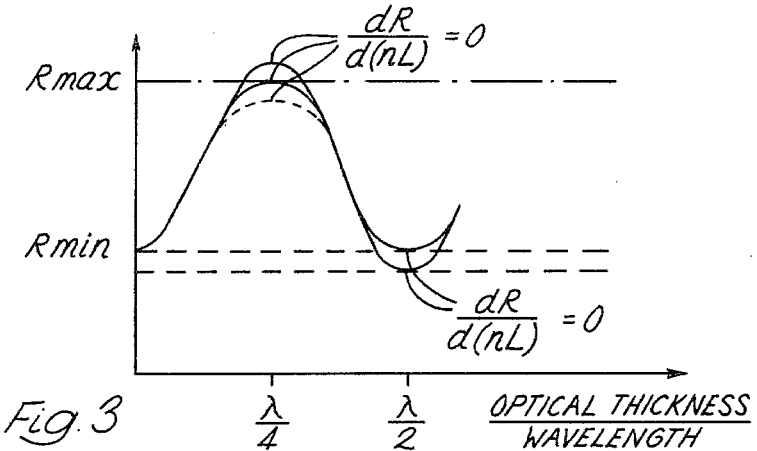
Figure 6:
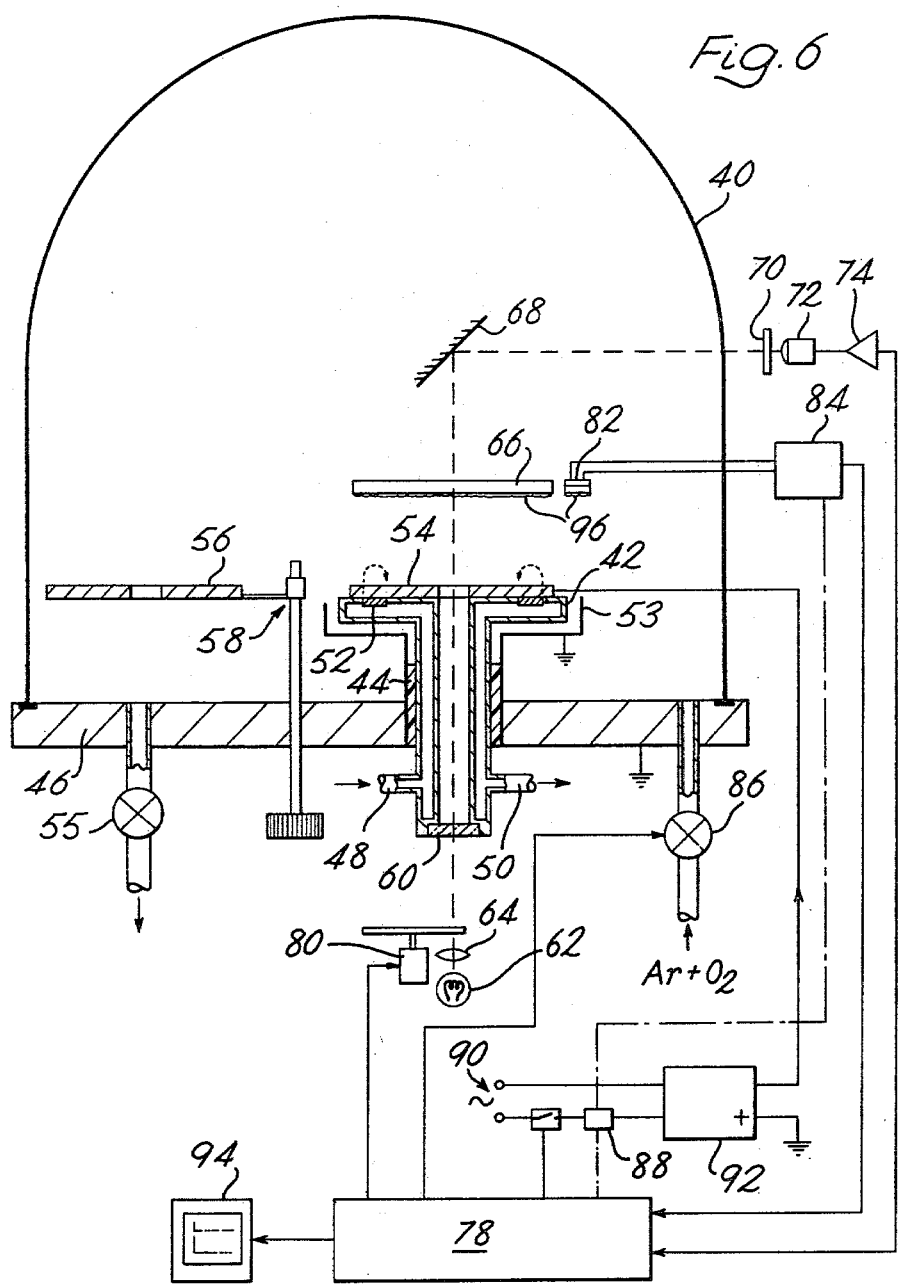

Referring now to the accompanying drawings,

FIGS. 1 and 2 are respectively theoretical and typical measured variations of reflectance with increase in film thickness, FIG. 3 is an enlarged view of part of FIG. 1 and FIG. 4 is a typical variation of film electrical resistivity with increase in film thickness. The invention will be described with reference to:

FIG. 5, which is a schematic sectional drawing of a reactive d.c. sputtering apparatus; and FIG. 6, which is a schematic sectional drawing of a magnetron sputtering apparatus.

FIG. 1 shows the theoretical variation of the reflectance R of a film deposited on a glass substrate of refractive index 1.5 as the film thickness increases. Two curves are shown, for films of refractive indices greater ($n=2.0$) and lower ($n=1.4$) respectively than the substrate. The curves exhibit maxima and minima at values of the optical thickness nL divided by wavelength of incident light λ which correspond to quarter-wave intervals; this is due to interference effects within the film. It is assumed that absorption within the film is negligible, but even highly absorbing films show this behaviour until the layer is thick enough to absorb all internally reflected light. If the refractive index of the film equals the refractive index of the substrate, there will be no variation in reflectance, as indicated by the dotted line for $n=1.5$. A plot of transmittance T of the film would give the inverse curves.

If the film growth rate is constant and the film density and refractive index remain constant with increasing mass, then the abscissa could also be considered to indicate increase with time. Typically, a deposition run lasts between 2 and 10 or even 20 minutes.

FIG. 2 shows a typical curve obtained by monitoring film growth using a conventional beam photometer and plotting reflectance against time. The curve irregularities are due to several effects such as instabilities in the deposition rate; for example if a powder is evaporated, volatilization may occur as a series of discrete events as particles come into contact with the heat source; alternatively, during a sputtering process, gas may be released from a target compound, which results in a change in ion density in the gas and a variation in deposition rate. Such instabilities cause changes in the mass growth rate, which affects the rate of increase of geometrical thickness, and may also have secondary effects on the optical thickness if the film density and refractive index are dependent on growth rate.

A further contribution to curve irregularities may be made by instrument noise, and the height of the measured maxima may decrease with time due to changes in the refractive index of the deposited film and to absorption.

It will be clear that the measured variation of reflectance with time is only an approximation to the variation of reflectance with the optical density of the deposited film.

It is often a requirement to terminate deposition at a reflectance or transmittance maximum or minimum, corresponding to a quarter-wave thick film, or a multiple thereof. It will be immediately apparent that serious errors can occur because R and T values change by only relatively small amounts near the turning points, and superimposed noise makes it even more difficult to locate the required point with any accuracy, because false maxima and minima may be detected.

These problems could be overcome if the curves of R and T were differentiated with respect to the optical thickness of the film. The quarter wavelength maxima and minima then correspond to zero values. As shown in FIG. 3, the differential of the curve at the maximum is zero even if the peak height differs from the theoretical maximum (three peak heights are shown), and the differential at the minimum is zero even if the reflectance of the substrate changes, as indicated by the two dotted lines.

A first embodiment of apparatus which allows such a differentiation to be carried out with optical thickness measured to terms of film mass is shown in FIG. 5. A conventional vacuum chamber 10 and its contents are shown in schematic form; a substrate 12 to be coated and a quartz crystal 14 are both exposed to a source of material to be deposited 16, which is connected to a d.c. power supply 18 to give reactive d.c. sputtering. The crystal 14 is driven by an oscillator 15 outside the vacuum chamber. The power supply 18 is controlled by a microprocessor 24. The chamber can be evacuated by a pump 20, and a gas can be supplied through an inlet pipe 22. If the source is a metal and an oxygen atmosphere is provided, then a metal oxide film will be deposited.

The quartz crystal is connected directly to the microprocessor 24.

A light source 26 illuminates the substrate 12 with a collimated beam through a beam splitter 28; reflected light is received via the beam splitter by a reflectance monitor 30, which is connected to the microprocessor; the source 26 and monitor 30 are connected together and to the microprocessor so as to allow operation in synchronism in a pulse mode controlled by the microprocessor. The position of a transmittance monitor 32 is indicated by the dotted line.

The monitors 30 and 32 each comprise a light detector such as a vacuum photocell or a solid state device together with the necessary power supplies. The sensor may provide a voltage or current of a magnitude representing the reflectance or transmittance of the coated substrate.

In operation, the chamber 10 is evacuated and oxygen is supplied to a pressure of between $10^{-2}$ and $10^{-1}$ torr, and a conventional reactive d.c. sputtering process is established in which material from the source 16 is deposited on both the substrate 12 and the quartz crystal 14, changing the resonant frequency of the crystal; the absolute resonant frequency of the crystal is sensed using the internal clock of the microprocessor 24. The reflectance of the film of material deposited on the substrate 12 is sensed by the reflectance monitor, which converts it to a frequency signal, the first signal, and supplies it to the microprocessor. The microprocessor therefore has available two digitised signals, and is arranged to calculate the required quotient over the first time interval. Conveniently, this first predetermined time interval is the period of the oscillatable crystal, and the change in the frequency of the first signal over this time interval is easily determined from the digitised information.

The average value of the quotient is supplied to a display unit 34 and may be used to supply information to an operator when the apparatus variables are controlled manually. Alternatively, in a fully automatic system, the output signal is used to control the d.c. power supply 18. Information relating to a required value or programme of values of the quotient may be stored in the microprocessor, and may include a value at which deposition is to be terminated.

The output of reflectance monitor 30 is a dimensionless value equivalent to reflected signal/incident signal. If this value is expressed as a frequency, then any change in frequency corresponds to a change $\delta R$ in reflectance R.

Considering now the quartz crystal; for a deposited film such that the film mass is small compared with the mass of the crystal, $$L = k\delta f / p f_q^2$$

where L is film thickness, k is a constant, $f_q$ is the basic resonant frequency of the quartz crystal and $\delta f$ is the change in that frequency, p is the film density, and $L = M/p$ where M is the film mass per unit area. It is also possible to measure the period of oscillation of the crystal, $\tau$, where $\tau = 1/f_q$, when the relation becomes $$L = K' \Delta \tau / p$$

where K' is a different constant. This expression is a better approximation at high mass loading.

Thus L is proportional to change in frequency or change in period of the crystal. Since refractive index n is essentially constant, the ratio of the change in the first signal over an interval of time to the change in oscillation frequency of the crystal over the same interval of time is an acceptable approximation to the differential of reflectance with respect to the optical thickness of the film. This differential is not dependent on the assumption that rate of deposition is constant with time and temporal fluctuations are accommodated.

However, it may be preferable in some circumstances, when it is known that temporal fluctuations in deposition will occur within a time interval of the same order as the first predetermined interval, thus causing fluctuations in reflectance or in deposition rate, to average the quotient over a second predetermined time interval, longer than the first, so that the effect of actual variations in deposition rate is eliminated.

This second interval of time may be, for example, 0.1 seconds or may be as long as 5 minutes for unusually prolonged deposition processes.

Information relating to a required value or programme of values of this averaged quotient may also be stored in the microprocessor, and the source controlled in accordance with the requirement.

Usually, refractive index of a film during deposition is constant, but film materials are known for which refractive index increases or decreases and film density also changes with growth of the film. When such established changes result in a departure from a linear relationship between increase in mass and increase in optical thickness, this can be allowed for when determining the value of the quotient at which deposition is to terminate.

There are further benefits from use of a microprocessor. If a film thickness corresponding to a known number of quarter wavelengths is required, then the microprocessor can be programmed to count the maxima and minima in the reflectance curve, corresponding to the number of zero points in the differential, and to terminate deposition when the required thickness is reached. Termination at a point between a maximum and a minimum is also possible.

Another beneficial aspect of the present invention is illustrated when for some reason the source fails and deposition ceases; a differential with respect to time would then be zero, because there is no temporal change. But the differential with respect to optical thickness remains at a constant value. The microprocessor can be programmed to recognise this condition, to give an alarm signal if required, and, when growth begins again, to continue the calculation of differential from the held value.

If the study or control of the spatial distribution of deposition is required, then additional quartz crystals, appropriately spaced in the vacuum chamber and each used in conjunction with an optical sensing instrument, can easily be incorporated. This would allow deposition of very uniform films, or films on curved surfaces. The several crystals need not all have the same basic resonance frequency. Also, several sources of material for deposition can be controlled independently by the microprocessor, which can rapidly determine the actual film mass distribution from the monitor crystals during deposition, and determine the independent source emission rates needed to provide a required mass distribution.

The microprocessor can control other variables of the apparatus, such as electron beam current if an electron beam evaporation apparatus is used, or the target and substrate bias potentials in an r.f. sputtering system, or other variables as appropriate.

Another problem which is met in prior art apparatus and which is overcome by the present invention is that, when deposition takes place in an ionised gas atmosphere (which may occur in either a PVD or a CVD process), the charged particles present may interact with the quartz crystal and cause incorrect readings of thickness of deposited material.

Electrostatic and magnetic shields can provide some protection, but cannot exclude energetic neutrals which can charge the crystal surface on impact by releasing electrons.

An alternative solution is to switch off the exciting discharge and measure the change in frequency of the quartz crystal without exposure to charged or energetic particles, but the time to make such measurements with conventional manually switched instruments is usually long enough, often several seconds, for the film surface to adsorb gases from the environment which become trapped in the film on subsequent growth, giving it an undesirable laminar structure.

In apparatus according to the invention, the microprocessor can be used to switch off the power supply to the exciting discharge for a very short period, such as microsecond or millisecond intervals, and to make a measurement of crystal frequency during that period. The time can be short enough for gas absorption on the film surface to be negligible. Further, such pulsed measurements of thickness can be made at known time intervals so that mass growth rate of the film can be determined.

When the exciting discharge is switched off, deposition of material will continue, because of thermal inertia in a heated container, or relatively slow speed of the shutter conventionally used to terminate deposition; but in apparatus according to the invention deposition in the absence of the discharge can be for such a short period that the properties of the film are essentially not affected.

A similar benefit, when using glow discharge apparatus, is that the pulse operation of the reflectance measurement can be synchronised with the switching-off of the power thus avoiding interference by light from the glow discharge. In this case, the deposition ceases when the power is off.

The invention is particularly applicable to the deposition of materials in which refractive index changes with deposition because the structure changes. The true film thickness then differs from that derived from nL assuming n and film density are constant. Examples of such materials are zirconium and aluminium; respective oxides of these metals are often used in multi-layer anti-reflection films. Use of the invention will show turning points as the film masses and the optical thickness changes combine to give maximum or minimum reflected energy.

In the second embodiment the invention is utilised in otherwise conventional apparatus for preparing multi-layer interference filters by magnetron sputtering. In magnetron sputtering, metals are sputtered in oxygen-containing atmospheres to deposit oxide films. A reduced pressure of between $10^{-3}$ and $10^{-2}$ torr is used and a magnetic field is superimposed on the electrode arrangement so that the electrons are trapped in magnetic loops and follow cycloidal paths. FIG. 6 shows a vacuum chamber 40 having a central circular cathode support 42 carried by a hollow stem 44 insulated from the chamber baseplate 46. The support 42 is water cooled and the stem has water inlet and outlet pipes 48, 50. A circular array of small magnets 52 is arranged with their axes radial to the cathode support and their upper surfaces flush with the surface of the support; the loop-shaped magnetic fields are illustrated by the dotted lines. The support is partly shielded by a grounded metal shield 53. The chamber 40 can be evacuated by a pump 55.

A silicon cathode 54 lies on the cathode support; the cathode has a central aperture. A similarly shaped titanium cathode 56 is held by a cathode-changing mechanism 58 operated from outside the vacuum chamber.

The hollow stem 44 of the cathode support is closed at its lower end by a glass window 60 through which a monitoring light beam can pass from a source 62, through a collimating lens 64 up through the hollow stem 44 and through a glass substrate 66 supported (by means not shown) above the aluminium cathode 54. The light beam is then reflected by a plane mirror 68 through a wavelength-selecting filter 70 to a photocell 72. The electrical signal from the photocell passes through an amplifier 74 to a microprocessor 78, which controls a light chopper 80 which chops the beam from the source 62.

Adjacent the substrate 66 is a high-frequency crystal 82 with a free surface aligned with the surface of the substrate. The crystal is connected through a crystal oscillator 84 to the microprocessor 78. The microprocessor also controls via a servo-motor controlled needle valve 86 the supply to the vacuum chamber 40 of a mixture of argon and oxygen; is connected to the thyristor power control 88 placed between a power source 90 and a d.c. power supply 92 which is connected to the aluminium cathode 54; and is connected to a visual display unit 94.

In operation, a glow discharge is generated in the vacuum chamber between the cathode 54 and the earthed shield 53 or base-plate 46 and silicon is sputtered from the silicon cathode 54 to be deposited on the surfaces of the glass substrate 66 and the crystal 82 as a film 96 of silicon dioxide. The presence of the magnetic field confines ion bombardment to a narrow annulus on the cathode. This allows a central aperture through which the light beam sensing film transmittance can pass.

In the apparatus shown in FIG. 6, the microprocessor 78 combines the quotient of the change in resonant frequency of the crystal 82 and the change in transmittance of the film 96, as in the FIG. 5 embodiment, to terminate deposition at a required value. The cathode-changing mechanism 58 is then operated to remove the silicon cathode 54 and place titanium cathode 56 on the electrode support. Titanium oxide film is then deposited as required.

However it is a characteristic of low pressure glow discharges that the sputtering rate can vary for several reasons, even if the discharge current and applied potential are constant. This may occur because the surface condition of the cathode varies, because contaminants are formed on or removed from its surface, or the profile changes as etched tracks form. In apparatus according to the present invention, the derivative of the frequency signal from the crystal 82 can be used to adjust the glow discharge conditions so that the change of resonant frequency with time, and thus the change of film mass with time, is constant. Either the needle valve 86 is adjusted to alter the gas pressure and therefore the glow discharge power input, or the thyristor 88 is adjusted to alter the electrical power input to the discharge. The thyristor, which is a semiconductor rectifier which can be arranged to become conducting for different periods during an a.c. cycle, can conveniently be used to switch off the electrical power supply during periods when the crystal oscillator 84 is energised and frequency measurements are being made. In the magnetron sputtering apparatus, secondary electrons released from the target cathode are bent back towards its surface and trapped by the closed magnetic loops. The measuring crystal 82 is therefore not exposed to the intense electron bombardment characteristic of r.f. and d.c. sputtering systems operated in the non-magnetron mode. A crystal exposed to a magnetron discharge, however, may reach a potential several volts negative with respect to earth unless it is kept earthed during the coating periods. The microprocessor 78 can be programmed to ground the crystal until a frequency measurement is required. Alternatively a separate switch 85 can be provided in the oscillator 84.

The apparatus has been described with particular reference to the measurement of optical reflectance or transmittance of the deposited film. Alternatively, electrical resistivity of a conducting or semiconducting film can be measured; such a curve does not show interference maxima and minima, but can be used to control thickness precisely. The two alternatives are not mutually exclusive, some conducting films also show optical interference effects.

Instead of instructing the microprocessor to provide values of the quotient averaged over a predetermined time interval, it could also be averaged over a variable time interval, each interval corresponding to a predetermined change in the second signal, that is, a predetermined increase in film thickness.

As an alternative to a microprocessor, a computer or microcomputer can be used, or any other calculating device having an internal clock or timing device which can be used to measure the absolute oscillation frequency of the quartz crystal.

I claim:

1. Apparatus for sensing and controlling the deposition of a thin film on to a substrate from a gas or vapour phase comprising:
    sensing means for (a) sensing the optical reflectance or optical transmittance or electrical resistivity of the deposited film and (b) providing a first signal having a parameter representative of the value of the sensed property;
    an oscillatable crystal arranged adjacent to the substrate with at least one surface of the crystal exposed to the gas or vapour phase; and
    timing and calculating means connected to the sensing means and to the oscillatable crystal and arranged to (a) determine the absolute resonance frequency of the oscillatable crystal, (b) provide a second signal representative of that frequency, to (c) determine the quotient of the change in the first signal and the change in the second signal over a first predetermined time interval, and (d) provide an output signal dependent on said quotient.

2. Apparatus according to claim 1 in which the first predetermined time interval is the period of the oscillatable crystal.

3. Apparatus according to claim 1 or claim 2 further comprising means for averaging the quotient over a second predetermined time interval.

4. Apparatus according to claim 1 in which the parameter of the first signal is frequency, the frequency representing the value of optical reflectance or transmittance or electrical resistivity, and in which the second signal is the output of the oscillatable crystal.

5. Apparatus according to claim 1 in which the apparatus is intended to control a deposition process in which an ionised gas atmosphere is generated, the apparatus further comprising:
    switching means controlled by the timing and calculating means and arranged to terminate the generation of the ionised gas atmosphere intermittently, the measurement of crystal frequency being made only while the ionised gas atmosphere is absent.

6. Apparatus according to claim 5 in which the deposition process is a reactive d.c. sputtering apparatus or a magnetron sputtering apparatus.

7. Apparatus according to claim 5 or claim 6 in which the generation of the ionised gas atmosphere is terminated intermittently for periods each less than 0.01 seconds.

8. Apparatus for depositing a thin film on to a substrate by physical vapour deposition or chemical vapour deposition comprising:
    a substrate support;
    means for generating a gas or vapour phase in the vicinity of the substrate support;
    sensing means arranged for (a) sensing the optical reflectance or optical transmittance or electrical resistively of the deposited film and (b) providing a first signal having a parameter representative of the value of the sensed property;
    an oscillatable crystal arranged adjacent to the substrate with at least one surface of the crystal exposed to the gas or vapour phase; and
    timing and calculating means connected to the sensing means and to the oscillatable crystal and arranged to (a) determine the absolute resonance frequency of the oscillatable crystal, (b) provide a second signal representative of that frequency, (c) determine the quotient of the change in the first signal and the change in the second signal over a first predetermined time interval, and (d) provide an output signal dependent on said quotient.

9. A method of sensing and controlling the deposition of a thin film on to a substrate from a gas or vapour phase comprising the steps of:
    sensing the optical reflectance or optical transmittance or electrical resistivity of the deposited film and providing a first signal having a parameter representative of the value of the sensed property;
    arranging an oscillatable crystal adjacent the substrate with at least one surface of the crystal exposed to the gas or vapour phase;
    determining by timing and calculating means the absolute resonance frequency of the oscillatable crystal and deriving a second signal having a parameter representative of said frequency;
    determining over a first predetermined interval of time the quotient of the change in the first signal and the change in the second signal;
    providing an output signal dependent on said quotient; and
    controlling a variable of the deposition process in accordance with the output signal.

10. A method according to claim 9 in which the optical reflectance or optical transmittance is sensed, and the deposition process is terminated at a reflectance or transmittance maximum or minimum.

* * * * *